US011295905B2

(12) United States Patent
Ward

(10) Patent No.: US 11,295,905 B2
(45) Date of Patent: *Apr. 5, 2022

(54) APPARATUS, SYSTEM, AND METHOD FOR PROVIDING AN ELECTRICAL NOTIFICATION SYSTEM

(71) Applicant: Mark A. Ward, Teaneck, NJ (US)

(72) Inventor: Mark A. Ward, Teaneck, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/134,294

(22) Filed: Dec. 26, 2020

(65) Prior Publication Data

US 2021/0366669 A1 Nov. 25, 2021

Related U.S. Application Data

(63) Continuation of application No. 16/879,355, filed on May 20, 2020, now Pat. No. 10,910,169.

(51) Int. Cl.
| | | |
|---|---|---|
| *H02H 3/00* | (2006.01) | |
| *H01H 9/16* | (2006.01) | |
| *H01H 33/28* | (2006.01) | |
| *H01H 33/02* | (2006.01) | |
| *H01H 9/54* | (2006.01) | |

(52) U.S. Cl.
CPC .............. *H01H 9/161* (2013.01); *H01H 9/54* (2013.01); *H01H 33/022* (2013.01); *H01H 33/28* (2013.01)

(58) Field of Classification Search
None
See application file for complete search history.

(56) References Cited

U.S. PATENT DOCUMENTS

| | | | |
|---|---|---|---|
| 3,581,725 A | | 6/1971 | Hemphill |
| 4,358,810 A | | 11/1982 | Wafer |
| 5,196,815 A | * | 3/1993 | Chien .................. H01H 71/121 335/16 |
| 5,493,278 A | | 2/1996 | Mackenzie |
| 9,054,516 B2 | | 6/2015 | Watford |
| 2013/0021163 A1 | | 1/2013 | Watford |

OTHER PUBLICATIONS

International Search Report and Written Opinion dated Sep. 14, 2021, of counterpart international application No. PCT/US2021/032163.

* cited by examiner

*Primary Examiner* — Stephen W Jackson
(74) *Attorney, Agent, or Firm* — Stephen L. Keefe LLC

(57) ABSTRACT

An apparatus for an electrical control assembly having at least one control member that is electrically connected to an electrical component, the at least one control member supported by an attachment assembly, which is disposed in a cavity of the electrical control assembly and includes a recess, the at least one control member movable between a first position and a second position is disclosed. The apparatus includes a structural assembly that is removably insertable in the recess of the attachment assembly, a through-beam emitter having an emitter member that is attached to a first end portion of the structural assembly and a receiver member that is attached to a second end portion of the structural assembly, the emitter member aligned to emit a light beam along a straight line of sight to the receiver member, and an electrical circuit.

20 Claims, 12 Drawing Sheets

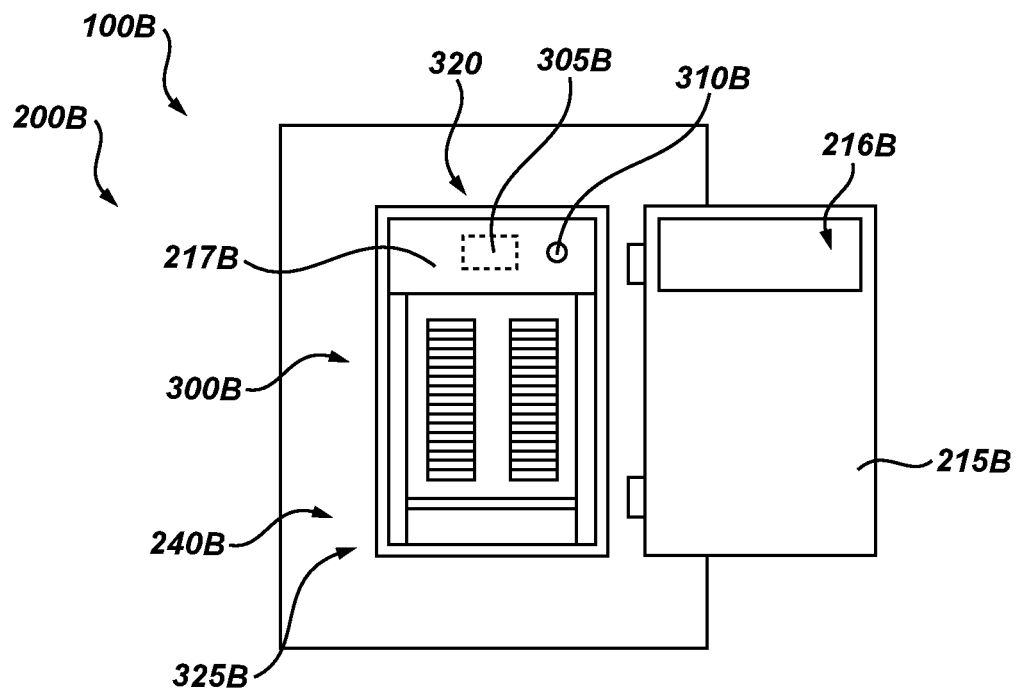
Fig. 6A
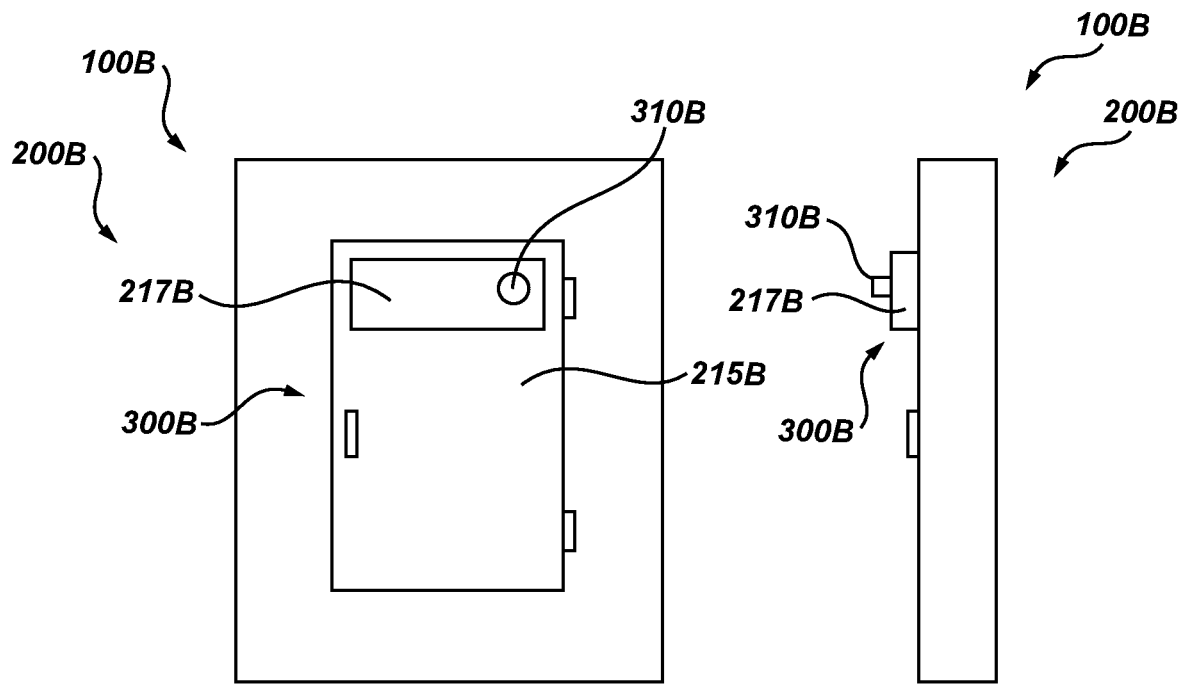
Fig. 6B     Fig. 6C

APPARATUS, SYSTEM, AND METHOD FOR PROVIDING AN ELECTRICAL NOTIFICATION SYSTEM

TECHNICAL FIELD

The present disclosure generally relates to a notification apparatus, system, and method, and more particularly to an apparatus, system, and method for providing an electrical notification system.

BACKGROUND

Over Current Protective Devices (OCPD) such as circuit breakers are designed to protect an electrical circuit from damage caused by excess current from a fault such as an overload or short circuit. Circuit breakers interrupt current flow by automatically tripping off once a fault is detected. Unlike a fuse that is used once and then replaced, circuit breakers provide for repeated use. After being tripped, circuit breakers can be reset after improper conditions are corrected.

Circuit breakers are often housed in electrical circuit breaker panels, which serve as main electrical distribution points for locations and facilities such as residential homes, businesses, and industrial plants and factories. Power received from utility electrical transfer lines is transferred to electrical circuit breaker panels, which typically include numerous circuit breakers, and is then distributed to electrical devices, appliances, and equipment.

Although circuit breakers and circuit breaker panels operate effectively to trip off when unsafe conditions such as short circuits and other faults exist, efficient and rapid identification of tripped circuit breakers is often difficult to achieve. Many locations such as hospitals, factories, sporting and entertainment venues, hotels, and other large buildings have dozens or hundreds of circuit breaker panels that are dispersed across a building or location. Also, many buildings and facilities include circuit breaker panels that are connected to devices or equipment located in different areas or different floors. Also, as circuit breaker panels are added or changed over time, overall electrical layouts can become complex. This can make identifying tripped circuit breakers quite difficult, as equipment that may have electricity tripped off by a given circuit breaker may be located on a different floor or an opposite end of a facility than the associated circuit breaker panel having the corresponding circuit breaker to be reset. The situation becomes worse when operating personnel are new or unfamiliar with the layout. Further, circuits and panels are often improperly labeled or not labeled at all, which further complicates finding and resetting circuit breakers. It is not uncommon for resetting a circuit breaker to take an hour or more in large and/or complicated facilities as operating personnel search through dozens or more circuit breaker panels all over a building or location to find a tripped circuit breaker.

Further, in such situations discussed above, tripped circuit breakers may not be detected at all. A tripped circuit breaker providing power to equipment may not be noticed by personnel for hours or days. For example, in large facilities such as hospitals and/or during minimally-staffed hours, a tripped circuit breaker may go unnoticed for significant periods of time with associated equipment being unpowered during that time. Such unnoticed inactivity of equipment can cause damage in many situations such as for refrigeration equipment, healthcare equipment, or safety equipment.

One attempt to address the above problems involves current transformers and battery management systems. In these types of systems, a current transformer typically measures a current of an electrical line. When the current in the electrical line deviates from a predetermined value, a notification is provided to users based on the current measurement. This scheme, however, does not identify the specific location of circuit breaker panels having tripped breakers. This type of system is also expensive to provide for every electrical line in a given location, particularly in large facilities. Retrofitting existing electrical layouts with these types of systems would also be relatively burdensome and expensive.

The exemplary disclosed apparatus, system, and method of the present disclosure are directed to overcoming one or more of the shortcomings set forth above and/or other deficiencies in existing technology.

SUMMARY OF THE DISCLOSURE

In one exemplary aspect, the present disclosure is directed to a method. The method includes attaching a light beam emitter to an electrical control assembly having at least one control member that is electrically connected to an electrical component, emitting a light beam from the light beam emitter across the at least one control member, moving the at least one control member between a first position in which the light beam is unblocked by the at least one control member and a second position in which the light beam is blocked by the at least one control member, and connecting the light beam emitter to a notification device via an electrical circuit. The method also includes preventing electrical current flow to the notification device when the at least one control member is in the first position, allowing electrical current flow to the notification device by switching the electrical circuit when the at least one control member moves from the first position to the second position, and moving the at least one control member from the first position to the second position when the at least one control member detects an electrical fault condition of the electrical component.

In another aspect, the present disclosure is directed to an apparatus for providing a notification for an electrical control assembly having at least one control member that is electrically connected to an electrical component, the at least one control member supported by an attachment assembly, which is disposed in a cavity of the electrical control assembly and includes a recess, the at least one control member movable between a first position and a second position. The apparatus includes a structural assembly that is removably insertable in the recess of the attachment assembly, and a through-beam emitter having an emitter member that is attached to a first end portion of the structural assembly and a receiver member that is attached to a second end portion of the structural assembly, the emitter member aligned to emit a light beam along a straight line of sight to the receiver member. The apparatus also includes an optical fiber amplifier that is attached to the emitter member and the receiver member via fiber optic cables and an electrical circuit including a power supply that powers the optical fiber amplifier and a notification device. The electrical circuit blocks current flow to the notification device when the at least one control member is in the first position in which the at least one control member does not block the straight line of sight. The electrical circuit allows current flow to the notification device when the at least one control member is in the second position in which the at least one control member blocks the straight line of sight.

BRIEF DESCRIPTION OF THE DRAWINGS

FIG. 6A is an elevation view of an exemplary embodiment of the present invention;

FIG. 6B is an elevation view of an exemplary embodiment of the present invention;

FIG. 6C is a side view of an exemplary embodiment of the present invention;

DETAILED DESCRIPTION AND INDUSTRIAL APPLICABILITY

Figure 1:
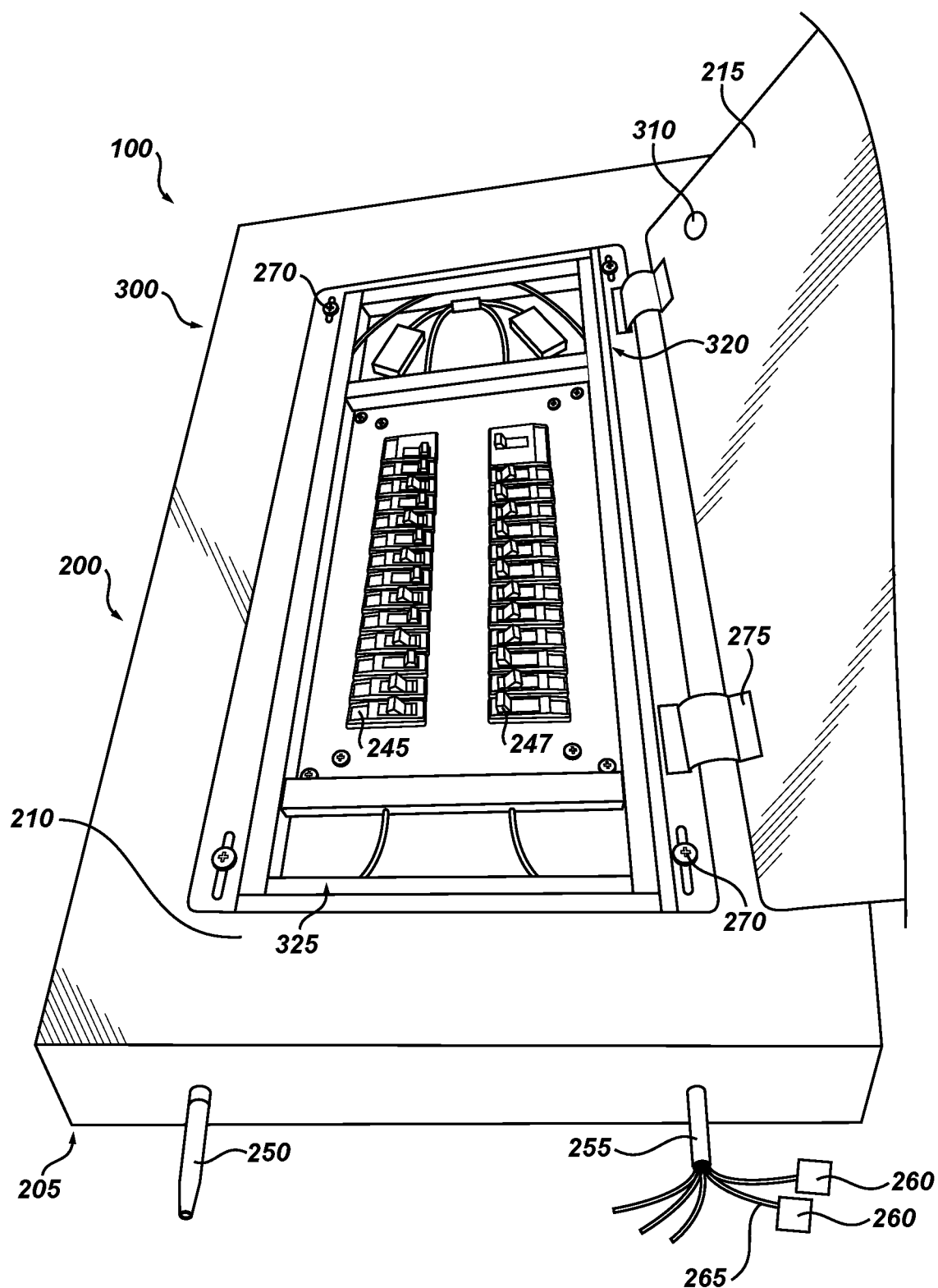
FIG. 1 is a perspective view of an exemplary embodiment of the present invention.
Figure 2:
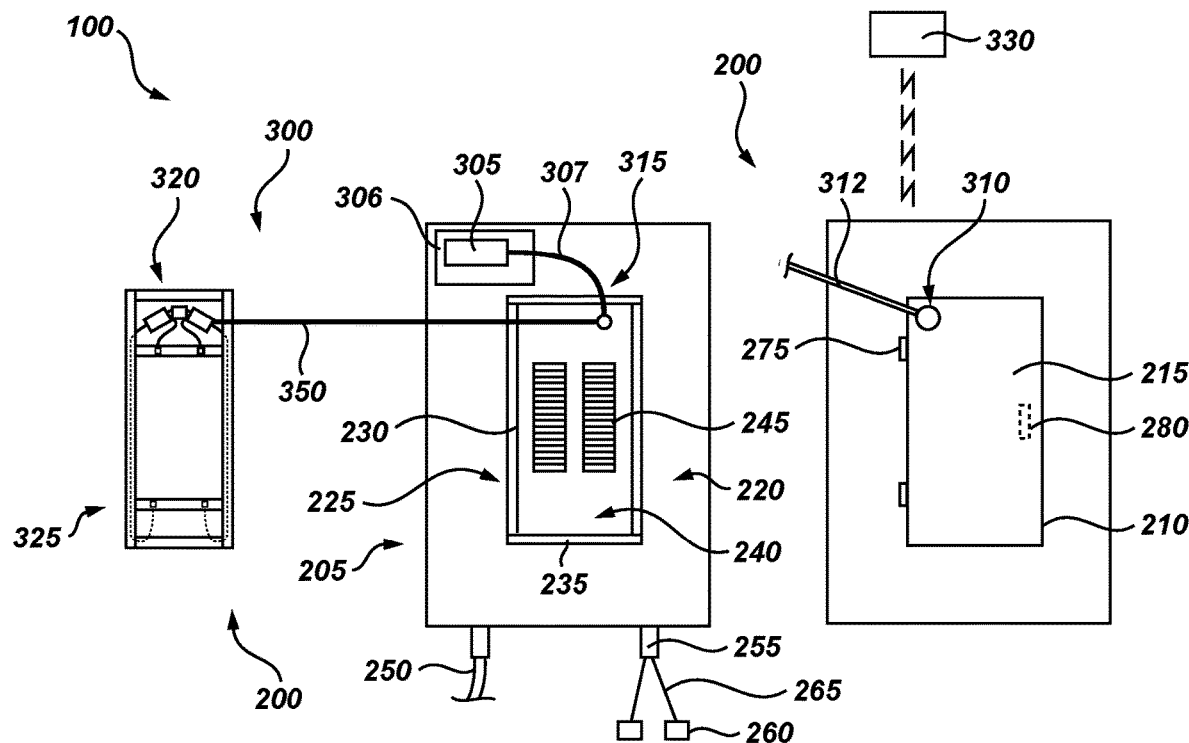
FIG. 2 is a schematic view of an exemplary embodiment of the present invention.
Figure 3:
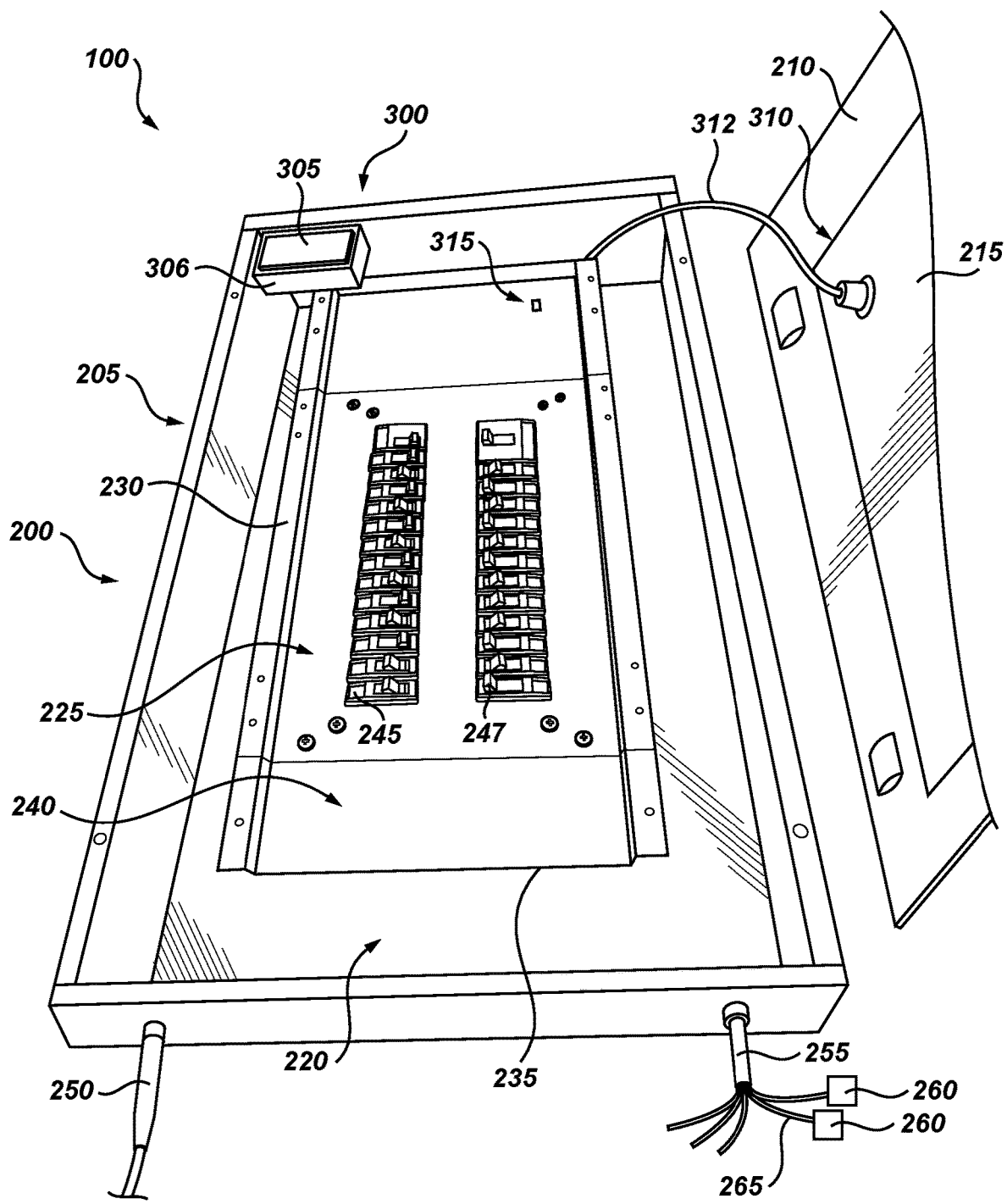
FIG. 3 is a perspective view of an exemplary embodiment of the present invention.

FIGS. 1-3 illustrate an exemplary embodiment of the exemplary disclosed apparatus and system. System 100 may include an electrical control system 200 and a notification system 300. System 100 may be an electrical control system that may provide a notification to users regarding a status of electrical components of an electrical system controlled by system 100. Notification system 300 may provide notifications to users of system 100 regarding a status of one or more components of electrical control system 200.

Electrical control system 200 may be any suitable system for controlling an electrical system. Electrical control system 200 may be an electrical distribution system (e.g., a distribution board). In at least some exemplary embodiments, electrical control system 200 may be a 3-phase (e.g., or any other desired phase such as 1-phase) panel for any desired number of circuits (e.g., 30 circuit, 42 circuit, or any other desired number of circuits). Electrical control system 200 may include a plurality of over current protective devices (OCPDs). For example, electrical control system 200 may include a circuit breaker panel having a plurality of circuit breakers. Electrical control system 200 may include a body assembly 205, a cover member 210, and an access member 215. Cover member 210 may be removably attached to and removably cover body assembly 205. Access member 215 may be attached to cover member 210 and may allow access to body assembly 205. Access member 215 may be for example an access door.

Body assembly 205, cover member 210, and access member 215 may be formed from any suitable structural material such as, for example, metal, plastics, composite material, or any other suitable structural material. For example, body assembly 205, cover member 210, and access member 215 may be formed from steel or any other suitable structural metal.

Body assembly 205 may be a structural housing having wall members that form a cavity 220 as illustrated in FIG. 3. For example, cavity 220 may be a "gutter" of body assembly 205. Body assembly 205 may include an attachment assembly 225 that may be disposed in cavity 220 and attached to structural supports of body assembly 205. Attachment assembly 225 may include a plurality of wall members 230 and 235 that may form a recess 240 that may removably receive an assembly of notification system 300 as described for example below.

A plurality of control members 245 may be disposed at (e.g., on and/or within) attachment assembly 225. Control member 245 may be an OCPD such as, for example, a circuit breaker, a fuse, a relay (e.g., thermal relay or protective relay), a ground-fault interrupter, or any other suitable device for stopping current based on predetermined conditions being met (e.g., based on a fault such as a short circuit or overload). In at least some exemplary embodiments, control member 245 may include a protrusion 247 that may extend from a movable member of control member 245 and may be selectively moved based on an operation of control member 245. Protrusion 247 may be a handle such as a circuit breaker handle. For example, protrusion 247 may be a circuit breaker protrusion that switches position based on control member 245 being tripped as for example described herein. For example as further described below, protrusion 247 may be positioned toward a side (e.g., not in a center) of control member 245 when control member 245 is not tripped, and may move (e.g., automatically move based on an operation of electrical control system 200) to be positioned at a center (e.g., mid-point position) of control member 245 when control member 245 is tripped. In at least some exemplary embodiments, control member 245 that has been tripped to have protrusion 247 at a center position may be reset by personnel by moving protrusion 247 (e.g., a handle) to one side that may be a full-off position and then to the other side that may be a full-on position. When control member 245 is tripped, protrusion 247 may move from the full-on position at a side of control member 245 to the tripped position at the middle (e.g., mid-point position) of control member 245.

Body assembly 205 may include a plurality of electrical connectors such as an electrical connector 250 and an electrical connector 255. Electrical connector 250 may connect electrical control system 200 to a power provider such as electrical lines operated by a utility company (e.g., sometimes called "the service entrance"). Electrical connector 255 may connect electrical control system 200 to a plurality of components 260 such as, for example, electrical accessories, devices, appliances, and/or equipment components (e.g., for residential, commercial, industrial, transportation, military, and/or any other desired applications). Electrical connector 255 may be connected to components 260 via any suitable electrical connectors 265 (e.g., wires or lines such as copper electrical wires). Electrical control system 200 may be configured so that a given control member 245 (or a group of control members 245) may be associated with a given component 260 (or a group of components 260). For example, when a given component 260 experiences an unsafe or fault condition (e.g., electrical fault condition), one or more associated control members 245 may be tripped to automatically interrupt current flow through electrical connector 265 connecting the given control member 245 to the given component 260 (e.g., control member 245 that may be an OCPD such as a circuit breaker may be tripped to stop current flow to the given component 260 experiencing an unsafe or fault condition).

Cover member 210 may be removably attached to body assembly 205 by any suitable technique such as mechanical fasteners, clips, magnets, adhesive strips, hook and loop fasteners, retractable locking devices, friction-fit locking devices, compressible locking devices, and/or any other suitable attachment devices. For example, cover member 210 may be removably attached to body assembly 205 by a plurality of fasteners 270 that may be received in corresponding aligned apertures of cover member 210 and body assembly 205. When attached to body assembly 205, cover member 210 may retain an assembly of notification system 300 as described for example below. For example, FIG. 1 illustrates cover member 210 attached to body assembly 205, and FIG. 3 illustrates cover member 210 removed from body assembly 205.

Access member 215 may be attached (e.g., rotatably attached) to cover member 210 via one or more hinges 275. Access member 215 may open and close to selectively cover an aperture of cover member 210 so that users such as operating personnel may access cavity 220 (e.g., access member 215 is illustrated in an open position in FIG. 1). Access member 215 may be locked in place in a closed position covering cavity 220 by any suitable locking mechanism (e.g., lock 280 as illustrated in FIG. 2).

Notification system 300 may include a power supply 305, a notification device such as a notification assembly 310, a connector 315, an amplification and emission assembly 320, and a structural assembly 325. Power supply 305 may provide power to components of notification system 300. Notification assembly 310, connector 315, and amplification and emission assembly 320 may be electrically connected together to operate to provide a notification to operators. Structural assembly 325 may support components of notification system 300. In at least some exemplary embodiments, notification system 300 may be an audible and visual electrical circuit breaker panel trip indicating system.

Power supply 305 may be any suitable power source for providing electrical energy to components of notification system 300. Power supply 305 may be any suitable transformer for converting AC power to DC power for use in powering components of notification system 300. In at least some exemplary embodiments, power supply 305 may convert 120 VAC power (e.g., or any other desired voltage such as between 100 VAC and 240 VAC) to 24 VDC power (or any other desired voltage). Any suitable voltage such as a low voltage or a line voltage may be provided to power supply 305. Power supply 305 may receive input voltage from any suitable power source such as electrical control system 200, an electrical outlet, and/or a battery storage. Power supply 305 may be any suitable switching power supply for powering components of notification system 300. Power supply 305 may be connected to other components of notification system 300 via one or more electrical connectors such as wires or cords (e.g., an electrical connector 307). Power supply 305 may be disposed in a housing 306 located in cavity 220, which may house and/or provide a barrier between power supply 305 and cavity 220. Electrical connector 307 may pass though a wall of housing 306.

Figure 2B:
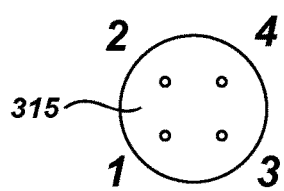
FIG. 2B is a schematic view of an exemplary embodiment of the present invention.
Figure 2A:
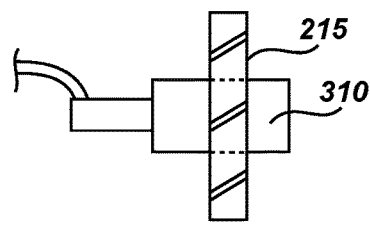
FIG. 2A is a schematic view of an exemplary embodiment of the present invention.

Notification assembly 310 may be any suitable assembly for providing audible, visual, and/or transmitted data notice that one or more control members 245 has been tripped as described for example herein. For example, notification assembly 310 may be an alarm device that may emit noise (e.g., an alarm) and/or flash (e.g., provide a flashing red or other color light) to notify operating personnel that control member 245 has been tripped. Notification assembly 310 may also include a transmitter (e.g., and/or a receiver) that may communicate with a device 330 as illustrated in FIG. 2. Device 330 may include a communication component that may communicate with notification assembly 310 either directly or via a network (e.g., via wireless or wire communication) to notify a user that one or more control members 245 has been tripped. For example, device 330 may be a smartphone or wireless computing device that may communicate with notification assembly 310 that may provide data regarding tripped circuit breakers (e.g., device 330 may act as an Internet of Things device). Notification assembly 310 may be connected to other components of notification system 300 via one or more electrical connectors such as wires or cords (e.g., an electrical connector 312). As illustrated in FIGS. 2 and 2A, notification assembly 310 may be supported at (e.g., on or in) access member 215. For example, notification assembly 310 may be received in an aperture of access member 215. For example in exemplary embodiments involving retrofit of an existing electrical control system 200, an aperture may be cut or drilled through access member 215 so that notification assembly 310 may be attached to access member 215 (e.g., or a replacement cover member 210 and/or access member 215 including notification assembly 310 may be provided). Notification assembly 310 may also be located at any other desired location of electrical control system 200.

Connector 315 may be disposed at attachment assembly 225. For example in exemplary embodiments involving retrofit of an existing electrical control system 200, an aperture may be cut or drilled through attachment assembly 225 so that connector 315 may be attached to attachment assembly 225 (for example similarly to the attachment of notification assembly 310 to access member 215 or by any other suitable technique). Connector 315 may be electrically connected to power supply 305. Connector 315 may be for example a male connector to which a female connector of amplification and emission assembly 320 (e.g., a female connector of electrical connector 307) may be removably connected as described below. Connector 315 may be any suitable type of connector such as, for example, a 4-pin connector as illustrated in FIG. 2B or any other suitable type of connection for transferring electrical power.

Figure 4:
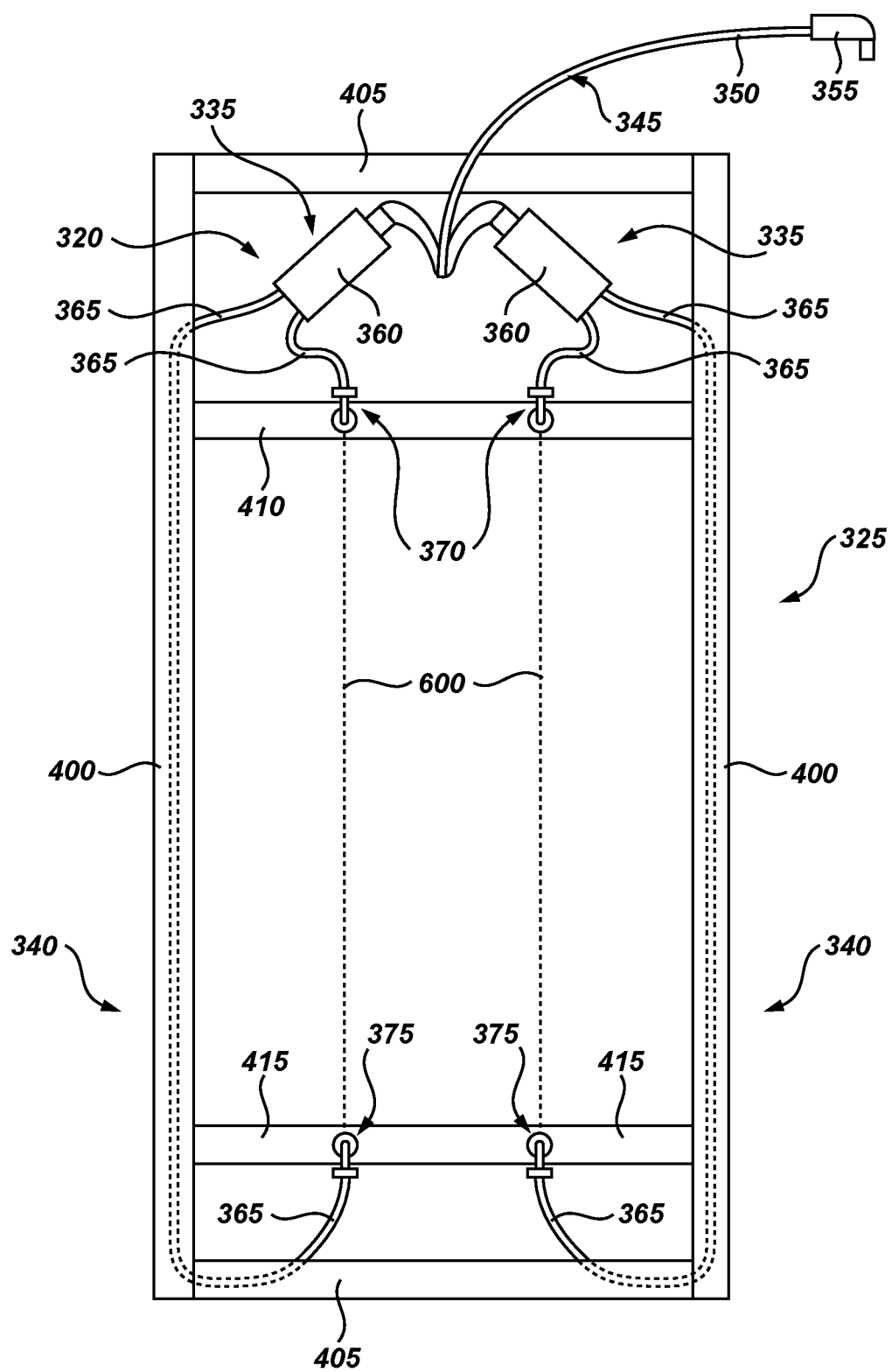
FIG. 4 is an elevation view of an exemplary embodiment of the present invention.

As illustrated in FIG. 4, amplification and emission assembly 320 may include one or more amplifier assemblies 335, one or more emitter assemblies 340, and one or more electrical connection assemblies 345. For example, amplification and emission assembly 320 may include two (e.g., or more) amplifier assemblies 335 and two (e.g., or more)

emitter assemblies 340. Electrical connection assembly 345 may provide electrical power to amplifier assembly 335 that may be electrically connected to emitter assembly 340.

Electrical connection assembly 345 may include an electrical connector 350 and connector 355 that may electrically connect amplification and emission assembly 320 to power supply 305. Connector 355 may be an electrical connector that may be removably attached to connector 315. In at some exemplary embodiments, connector 355 may be a female electrical connector. Connector 355 may be any suitable type of connector such as, for example, a 4-pin connector or any other suitable type of connection for transferring electrical power. As illustrated in FIG. 4, electrical connection assembly 345 may also include electrical connectors (e.g., wires or cords) that may electrically connect amplifier assemblies 335 and emitter assemblies 340.

Each amplifier assembly 335 may include an amplifier 360 that may be electrically connected to other components of amplification and emission assembly 320 via electrical connection assembly 345. For example, amplification and emission assembly 320 may include one, two, or more (e.g., between three and twelve or more) amplifiers 360. Power supply 305 may power each amplifier 360 via electrical connectors 307 and 350. Amplifier 360 may be any suitable amplification device for operation with emitter assembly 340. Amplifier 360 may operate as a switch with emitter assembly 340 as described for example below (e.g., as an amplifier switching relay). Amplifier 360 may be any suitable optical amplifier or any other suitable device for amplifying an optical signal directly. For example, amplifier 360 may be an optical fiber amplifier. For example, amplifier 360 may operate with emitter assembly 340 based on light-on/dark-on output. Amplifier 360 may have any suitable switching distance (e.g., 200 mm or any other suitable distance).

Each emitter assembly 340 may be any suitable fiber optic assembly for emitting light for example as described herein. Emitter assembly 340 may be any suitable optic assembly such as, for example, a through-beam assembly, a proximity-sensing assembly (e.g., a diffused assembly), or a retroreflective assembly. Emitter assembly 340 may be a through-beam emitter assembly such as a through-beam sensor.

In at least some exemplary embodiments, each emitter assembly 340 may include a plurality of connectors 365, an emitter member 370, and a receiver member 375. Connector 365 may be any suitable fiber optic cable. In at least some exemplary embodiments, connector 365 may have an optical core diameter of between about 1 mm and about 2 mm. For example, connector 365 may have an optical fiber core diameter of 1.5 mm and a total cable diameter of 2.2 mm. Connector 365 may include PMMA fiber material surrounded by any suitable sleeve material (e.g., polyethylene material). Emitter member 370 and/or receiver member 375 may have an M4 head size (e.g., M4×0.7 mm thread pitch) or any other suitable head size such as, for example, M3 or M6. Emitter member 370 and receiver member 375 may be formed from any suitable materials such as, for example, nickel-plated brass. Emitter member 370 and/or receiver member 375 may have any suitable size so as to emit and/or receive a light beam through a gap present between control members 245 set in an on or off position (e.g., a first position) without contacting these control members as described for example herein. Emitter member 370 may be aligned to emit a light beam along a straight line of sight to receiver member 375. Amplification and emission assembly 320 may include any suitable number of emitter assemblies 340 such as one, two, or more (e.g., between three and twelve or more) emitter assemblies 340. Emitter assemblies 340 may be electrically connected to amplifier assemblies 335 via electrical connection assembly 345. A given amplifier assembly 335 may operate in conjunction with a corresponding emitter assembly 340 (e.g., a given amplifier 360 may operate with a corresponding emitter member 370, receiver member 375, and connectors 365).

It is also contemplated that a mechanical system may be added in addition to or in place of emitter assembly 340. For example, an elongated mechanical member such as a cable, cord, or other tension member (e.g., or a flexible member) may be attached to structural assembly 325 and may extend and be aligned similarly to the exemplary disclosed light beam described herein. The mechanical member may be used in conjunction with notification system 300 to provide a switching mechanism similar to the exemplary operation of emitter assembly 340 described herein.

Figure 5:
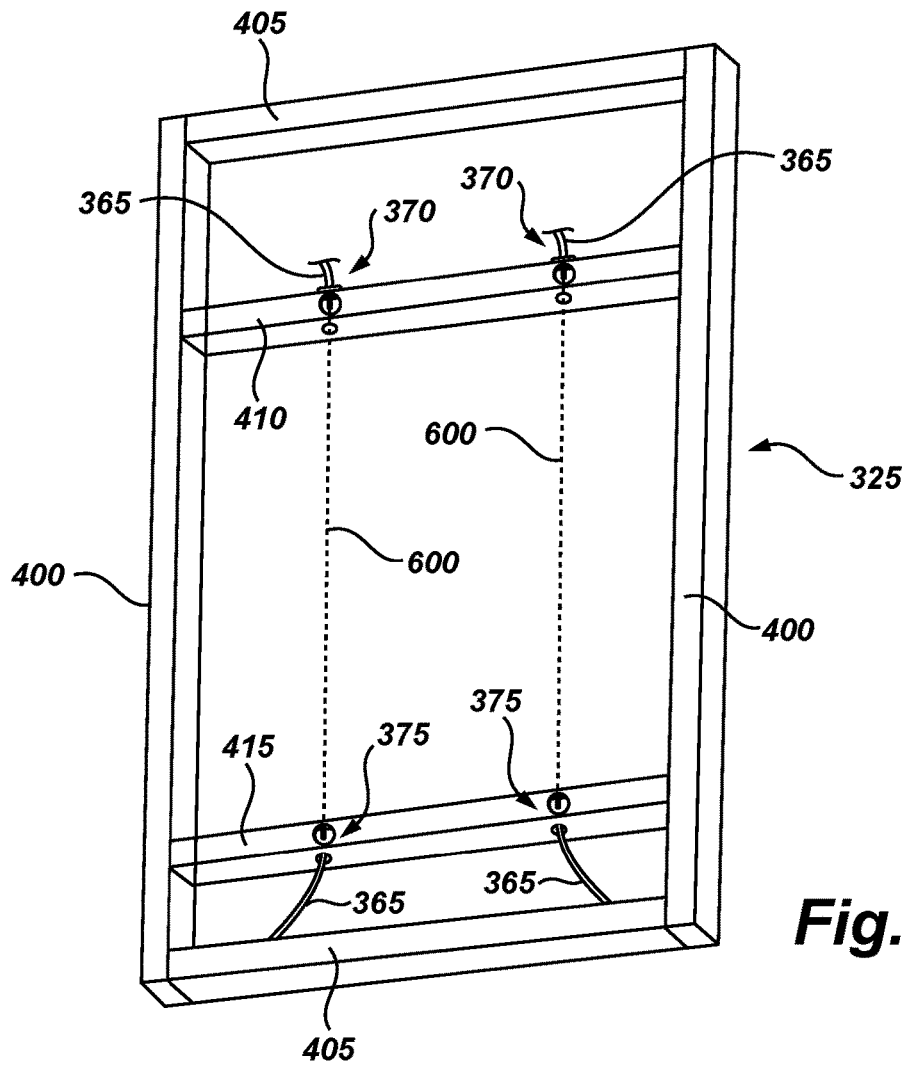
FIG. 5 is a perspective view of an exemplary embodiment of the present invention.

As illustrated in FIGS. 4 and 5, structural assembly 325 may support components of amplification and emission assembly 320. Structural assembly 325 may be formed form any suitable structural materials such as, for example, materials similar to body assembly 205, cover member 210, and access member 215. Structural assembly 325 may include structural members 400, structural members 405, a structural member 410, and a structural member 415. Structural members 400, structural members 405, structural member 410, and structural member 415 may be any suitable structural members for forming structural assembly 325 such as, for example, structural tubes (e.g., having a square, rectangular, or any other desired shape) such as hollow tubes, built-up structural members, or any other suitable structural members. Structural members 400, structural members 405, structural member 410, and structural member 415 may be attached by any suitable technique such as, for example, welding, via mechanical fasteners, adhesive, magnets, hook and loop, friction-fit connections, or any other suitable technique.

Structural assembly 325 may be configured and sized to be received in recess 240 of attachment assembly 225. For example, when cover member 210 has been removed from body assembly 205 as illustrated in FIG. 3, structural assembly 325 may be disposed in recess 240 so that structural members 400 are adjacent to and/or abut against respective wall members 230, and structural members 405 are adjacent to and/or abut against respective wall members 235. When structural assembly 325 is disposed in recess 240 and cover member 210 is attached to body assembly 205 as illustrated in FIG. 1, cover member 210 may retain (e.g., securely retain) structural assembly 325 in recess 240.

Figure 5A:
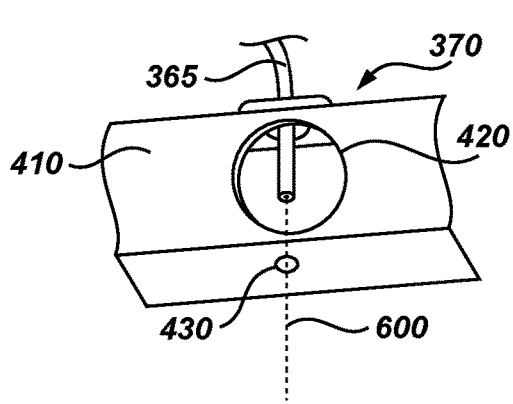
FIG. 5A is a perspective view of an exemplary embodiment of the present invention.
Figure 5B:
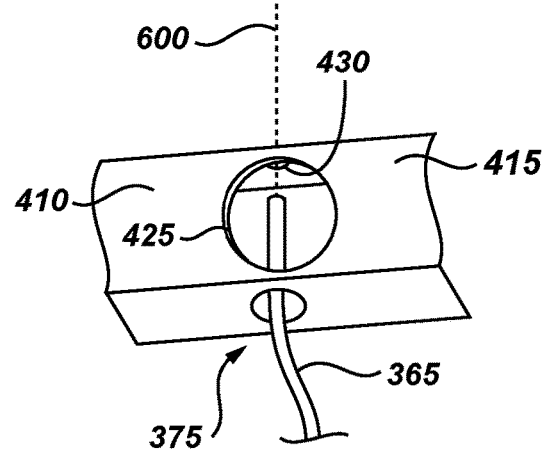
FIG. 5B is a perspective view of an exemplary embodiment of the present invention.

Returning to FIGS. 4 and 5, emitter member 370 may be fastened to structural member 410, and receiver member 375 may be fastened to structural member 415 (e.g., by a mechanical fastener, adhesive, or any other suitable fastening technique). For the sake of clarity in illustrating structural assembly 325 in FIG. 5, some portions of amplification and emission assembly 320 have not been shown. A given emitter member 370 may be aligned with a given corresponding receiver member 375 so that a light beam emitted by emitter member 370 is received by the corresponding receiver member 375. Emitter member 370 and receiver member 375 may be connected via connectors 365 to a corresponding amplifier 360. As illustrated in FIGS. 5A and 5B, structural members 410 and 415 may include respective apertures 420 and 425 for accessing, fastening, and/or adjusting emitter respective member 370 and receiver member 375. Structural members 410 and 415 may also include apertures 430 that may be aligned with a light beam emitter of emitter member 370 and a light beam receiver of receiver member 375 so that a light beam emitted and received by emitter assembly 340 may pass through walls of structural assembly 325. As illustrated in FIGS. 5, 5A, and 5B, each aperture 430 may be disposed on an opposite wall to another wall of structural member 410 or 415 to which emitter member 370 or receiver member 375 is attached (e.g., structural members 410 and 415 may be hollow members made up of a plurality of walls or wall portions). Apertures 430 may be disposed on surfaces of structural members 410 and 415 that face each other and may be aligned with each other (e.g., so that a light beam emitted and received by an aligned set of emitter member 370 and receiver member 375 may pass through aligned apertures 430).

Figure 6:
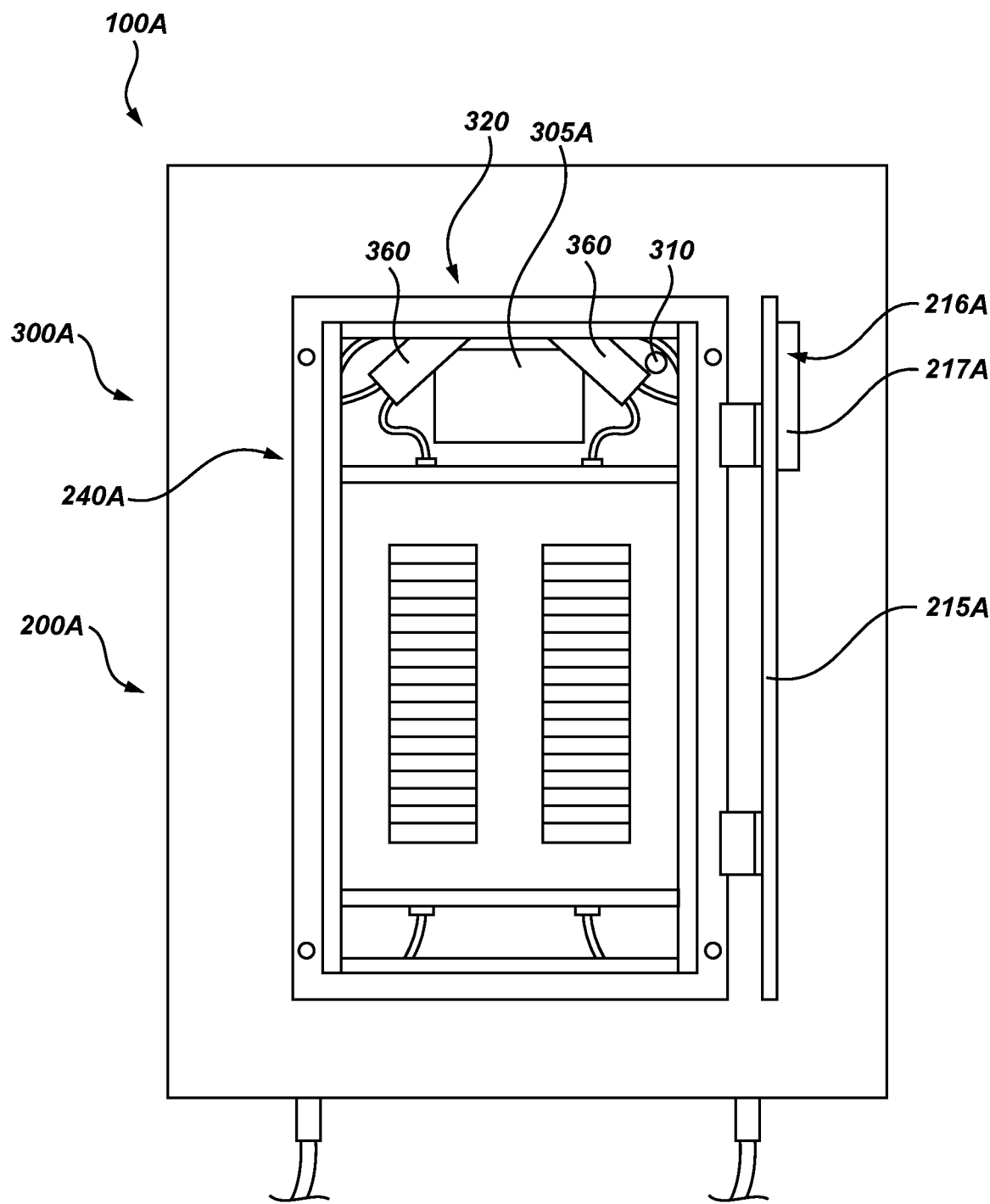
FIG. 6 is an elevation view of an exemplary embodiment of the present invention.

FIG. 6 illustrates another exemplary embodiment of the exemplary disclosed apparatus, system, and method. System 100A may include an electrical control system 200A that may be generally similar to electrical control system 200 and a notification system 300A that may be generally similar to notification system 300. Notification system 300A may include a power supply 305A that may be generally similar to power supply 305. Power supply 305A may be co-located with amplification and emission assembly 320 in a recess 240A that may be similar to recess 240. Because power supply 305A disposed in recess 240A may extend beyond an available clearance or space within recess 240A when an access member 215A (e.g., that may be similar to access member 215) is closed, an aperture 216A may be provided in access member 215A through which a portion of power supply 305A may pass. A housing 217A may be attached to access member 215A and may cover aperture 216A provided in access member 215A. Housing 217A may thereby receive and house a portion of power supply 305A so that power supply 305A (e.g., and notification system 300A) may be substantially housed in electrical control system 200A and covered by access member 215A when access member 215A is closed when power supply 305A is disposed in recess 240A.

FIGS. 6A, 6B, and 6C illustrate another exemplary embodiment of the exemplary disclosed apparatus, system, and method. System 100B may include an electrical control system 200B that may be generally similar to electrical control system 200 and a notification system 300B that may be generally similar to notification system 300. Notification system 300B may include a power supply 305B that may be generally similar to power supply 305 and that may be co-located with amplification and emission assembly 320 in a recess 240B that may be similar to recess 240. A housing 217B that may be similar to housing 217A may be attached to a structural assembly 325B that may be similar to structural assembly 325. Housing 217B may be attached to structural assembly 325B by any suitable technique (e.g., welding, fasteners, or any other suitable technique such as the exemplary attachment techniques described herein) and may house components of amplification and emission assembly 320 and power supply 305B. A notification assembly 310B that may be similar to notification assembly 310 may be provided in and/or may extend through housing 217B. An aperture 216B that may be similar to aperture 216A may be provided in access member 215B that may be similar to access member 215A. Aperture 216B may be sized to receive housing 217B. When access member 215B is closed, housing 217B may pass through aperture 216B so that housing 217B extends through aperture 216B. Housing 217B including notification assembly 310B may thereby be visible to users and other personnel when access member 215B is closed.

Figure 7A:
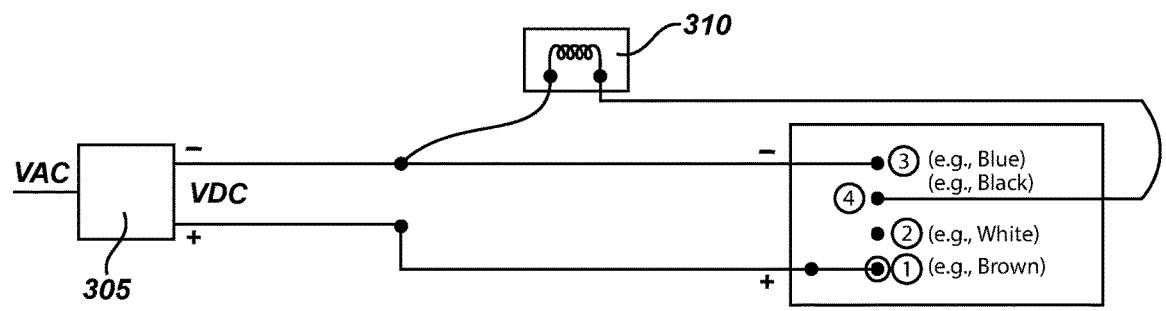
FIG. 7A is a schematic view of an exemplary embodiment of the present invention.
Figure 7B:
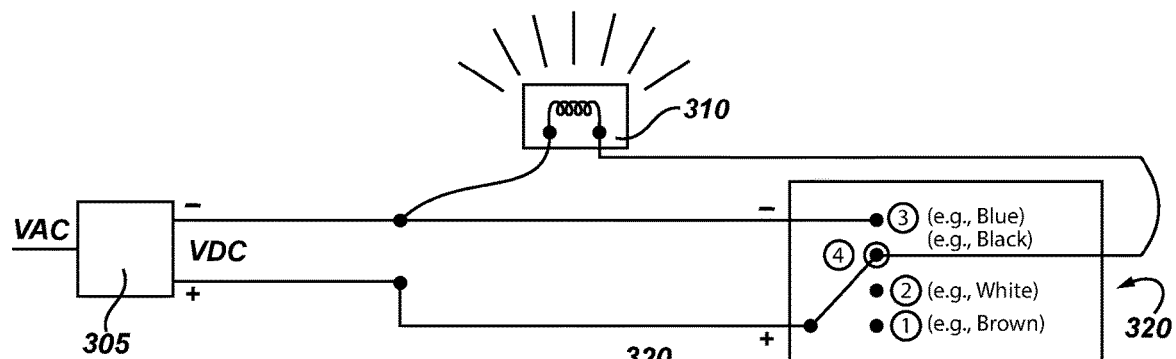
FIG. 7B is a schematic view of an exemplary embodiment of the present invention.
Figure 7C:
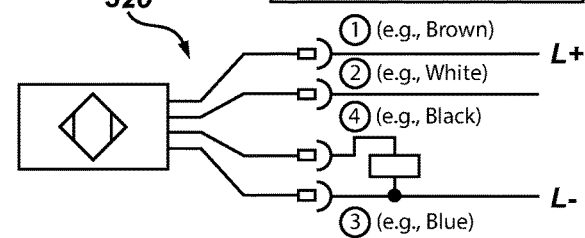
FIG. 7C is a schematic view of an exemplary embodiment of the present invention.

Electrical connection assembly 345, electrical connectors 307, 312, and 350, and/or any other suitable electrical connections (e.g., return lines or any other suitable electrical connection that may not be shown for clarity) may connect the exemplary disclosed components of notification system 300 (e.g., and electrical control system 200). FIGS. 7A, 7B, and 7C illustrate an exemplary embodiment of an exemplary disclosed schematic electrical circuit formed by exemplary disclosed components of notification system 300.

FIGS. 7A, 7B, and 7C schematically illustrate how amplification and emission assembly 320 (e.g., amplifier assembly 335 and emitter assembly 340) may operate as an electrical switch. Power supply 305 may convert AC electricity to DC electricity. Exemplary embodiments of the circuit are schematically illustrated: "1" (e.g., brown), "2" (e.g., white), "3" (e.g., blue), and "4" (e.g., black). Electrical current may be transferred from power supply 305 to amplification and emission assembly 320 (e.g., via "1"). As illustrated in FIG. 7A and described for example herein, the exemplary circuit may connect amplification and emission assembly 320 back to power supply 305 when a light beam of amplification and emission assembly 320 is not blocked (e.g., via "3"). As illustrated in FIG. 7A, the exemplary disclosed circuit may thereby selectively prevent electrical current flow to notification assembly 310. As illustrated in FIG. 7B and described for example herein, the exemplary circuit may connect amplification and emission assembly 320 to notification assembly 310 (e.g., via "4") when a light beam of amplification and emission assembly 320 is blocked, causing notification assembly 310 to activate (e.g., to sound an alarm and/or issue a notification as described herein). As illustrated in FIG. 7B, the exemplary disclosed circuit may thereby selectively allow electrical current flow to notification assembly 310. For example, amplification and emission assembly 320 may switch from "1" (e.g., brown) to "4" (e.g., black) when the light beam is blocked as described herein. In at least some exemplary embodiments, the exemplary disclosed circuit may be switched internally in amplifier 360 (e.g., "1" may close contact with "4" when the light beam is blocked as described herein). While FIGS. 7A to 7C provide an exemplary schematic illustration, any suitable configuration for an electrical circuit may be used to activate an alarm when one or more control members 245 move to a position blocking a light beam of emitter assembly 340 as described herein.

The exemplary disclosed apparatus, system, and method may be used in any suitable application involving OCPDs such as circuit breakers. For example, the exemplary disclosed apparatus, system, and method may be used in any suitable electrical control assembly such as circuit breaker panels that may be located in any desired residential, commercial, industrial, military and/or any other location or application including electrical components. In at least some exemplary embodiments, the exemplary disclosed apparatus, system, and method may be used in residential homes, large buildings such as skyscrapers or factories, hospitals or other medical facilities, stadiums and other sporting locations or arenas, entertainment venues such as theaters and concert halls, retail stores, waterborne vessels such as ships, transportation structures such as bridges and dams, aircraft, and/or any other suitable location including electrically-powered equipment.

Figure 8:
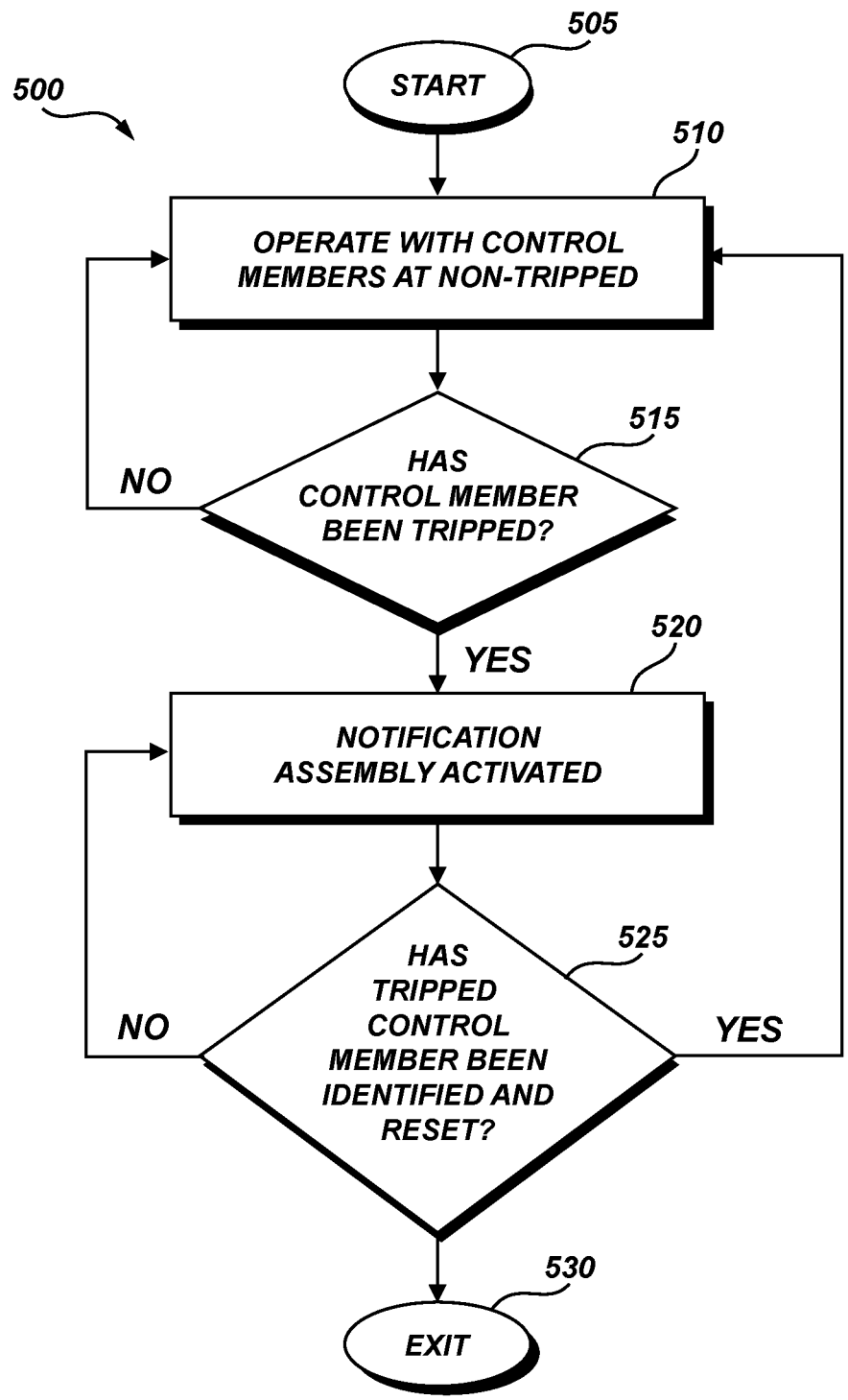
FIG. 8 is a flowchart showing an exemplary process of the present invention.

An exemplary operation of the exemplary disclosed apparatus, system, and method will now be described. For example, FIG. 8 illustrates an exemplary process 500 of system 100. A process of system 100A may be similar to process 500. Process 500 begins at step 505. A new electrical control system 200 having notification system 300 may be provided at step 505. Alternatively at step 505, an existing electrical control system 200 may be retrofitted with notification system 300 as described for example herein.

Figure 9A:
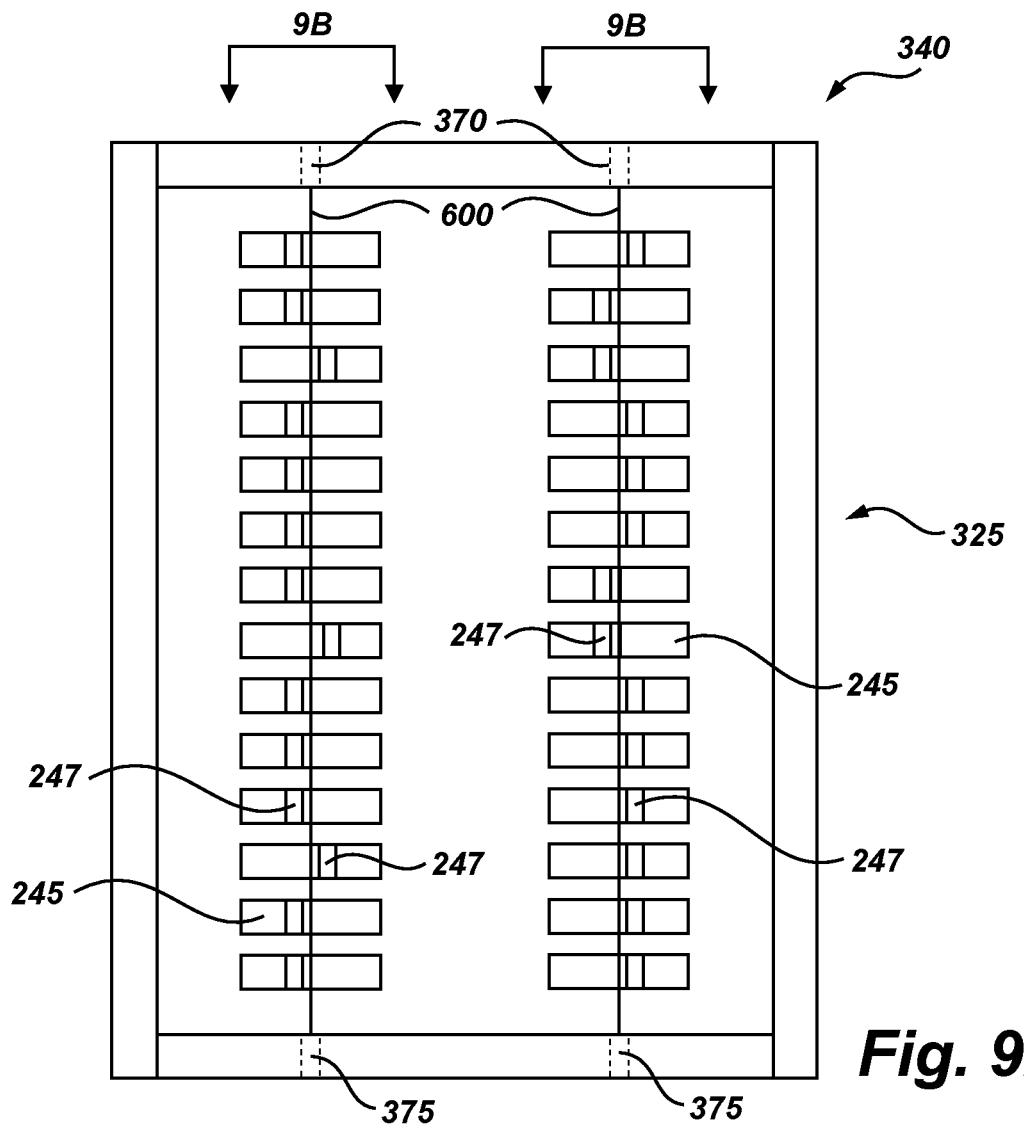
FIG. 9A is a schematic view of an exemplary embodiment of the present invention.
Figure 9B:
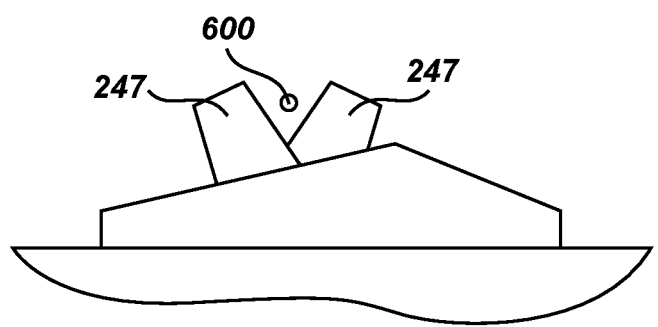
FIG. 9B is a schematic view of an exemplary embodiment of the present invention.

At step 510, system 100 may operate in a normal condition or normal mode of operation in which control members 245 are not tripped. For example as illustrated in FIG. 9A, control members 245 may be set to a first position that may be an "off" or "on" position in which protrusions 247 are disposed to the side (e.g., not in a center position or not in a mid-point position). Amplification and emission assembly 320 (e.g., one or more emitter assemblies 340) may emit one or more light beams (e.g., light beams 600) for example as described herein. At step 510 and as illustrated in FIGS. 9A and 9B, each light beam 600 may be emitted from emitter member 370, pass over or by control members 245 without being obstructed by a portion of each control member 245 (e.g., without being obstructed by protrusion 247), and contact receiver member 375. At step 510, light beam 600 may be unblocked by control members 245. Notification system 300 operates at step 510 in a normal mode of operation as illustrated in FIG. 7A. For example, the circuit may connect amplification and emission assembly 320 back to power supply 305 when all light beams 600 of amplification and emission assembly 320 are not blocked. FIG. 9B illustrates a schematic side view showing light beam 600 passing by protrusions 247 of control members 245 without being blocked (e.g., without being partially or entirely blocked). As illustrated in FIG. 9B, control members 245 may be in one or more first positions that do not block light beam 600.

Returning to FIG. 8, system 100 may determine whether or not at least one control member 245 has blocked light beam 600 at step 515. If light beams 600 of notification system 300 are not obstructed by one or more control members 245, system 100 may return to step 510 and remain in a normal mode of operation. However, if a component 260 of system 100 operates improperly (e.g., experiences a fault such as overload or short circuit), system 100 will operate to trip control member 245 to a tripped position as described herein. In the case that one or more control members 245 is tripped, system 100 will proceed to step 520.

Figure 10A:
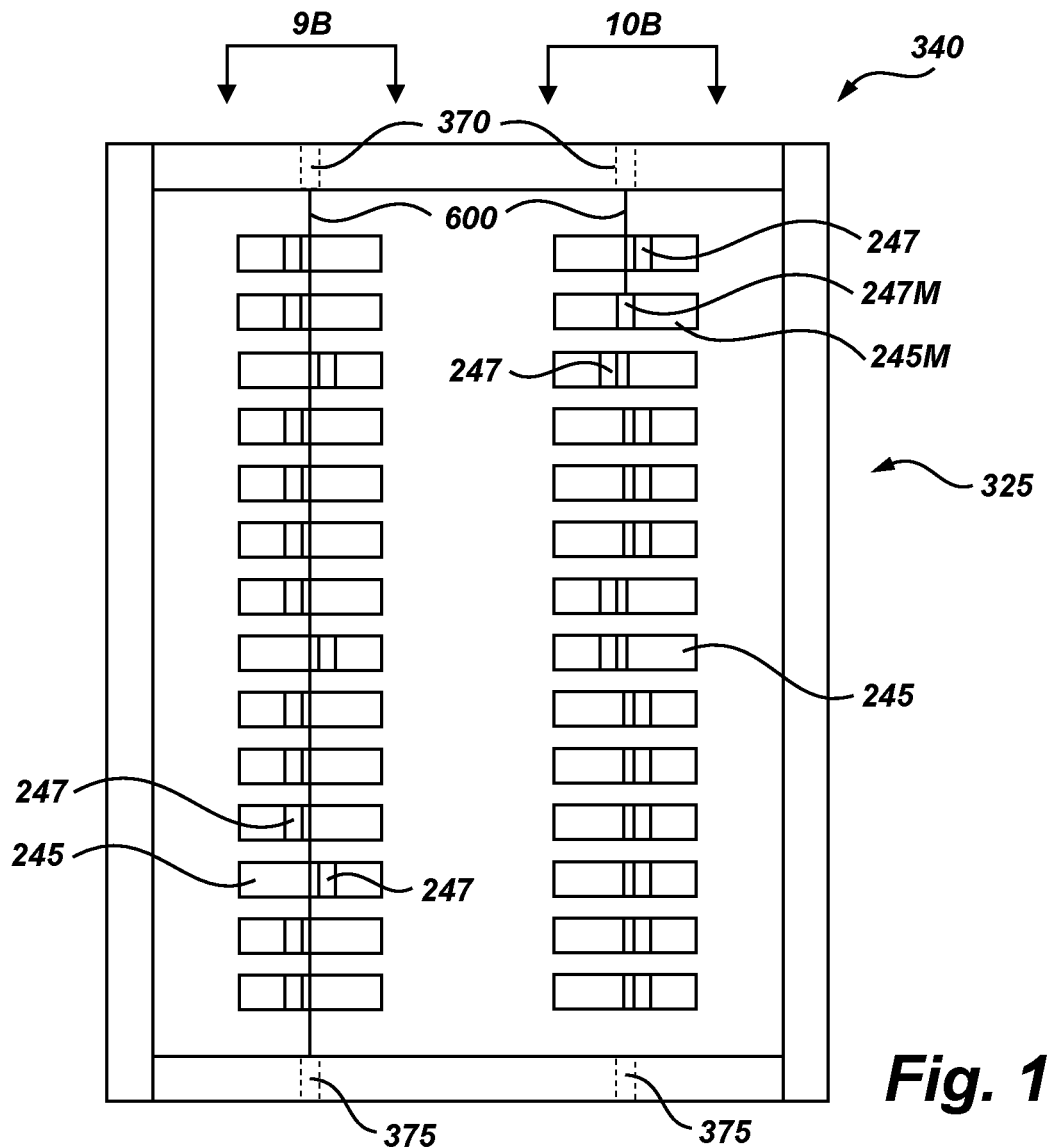
FIG. 10A is a schematic view of an exemplary embodiment of the present invention.
Figure 10B:
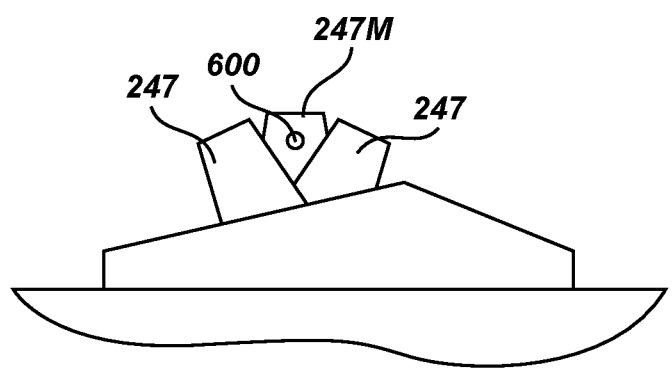
FIG. 10B is a schematic view of an exemplary embodiment of the present invention.
Figure 10C:
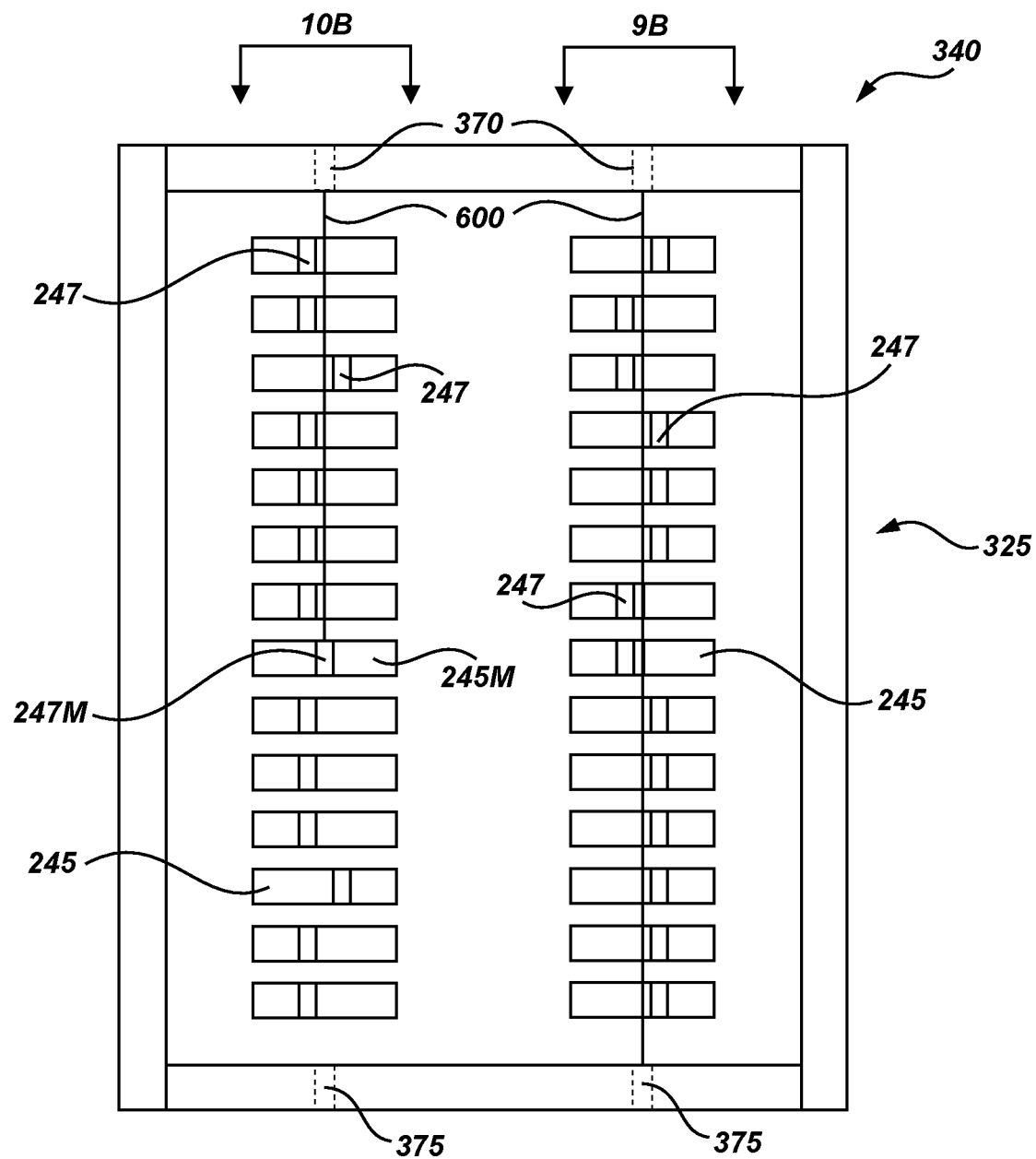
FIG. 10C is a schematic view of an exemplary embodiment of the present invention.

At step 520, system 100 may operate in a notification condition or notification mode of operation in which at least one control member 245 is tripped. For example as illustrated in FIGS. 10A and 10C, one or more control members 245 may be set to "off" or "on" positions in which protrusions 247 are disposed to the side (e.g., not in a center position or not in a mid-point position), and at least one control member 245 (designated by control member "245M") may be tripped as described herein to a tripped position (e.g., in a center position or a mid-point position) in which protrusion 247 (designated by protrusion "247M") is disposed at a center or midpoint position. At step 520 and as illustrated in FIGS. 10A, 10B, and 10C, at least one light beam 600 emitted from emitter member 370 is obstructed by a portion of control member 245M (e.g., obstructed by protrusion 247M), and does not contact receiver member 375. For example, FIG. 10A illustrates light beam 600 disposed on the right side being obstructed and FIG. 10C illustrates light beam 600 on the left side being obstructed (e.g., or both light beams 600 may also be obstructed by any tripped control member 245 at step 520). Notification system 300 operates at step 520 in a notification mode of operation as illustrated in FIG. 7B. As illustrated in FIG. 7B, the exemplary circuit connects amplification and emission assembly 320 to notification assembly 310 when at least one light beam 600 of amplification and emission assembly 320 is blocked, causing notification assembly 310 to activate. For example, amplification and emission assembly 320 switches from "1" (e.g., brown) as illustrated in FIG. 7A to "4" (e.g., black) as illustrated in FIG. 7B when at least one light beam 600 is blocked. FIG. 10B illustrates a schematic side view showing light beam 600 being obstructed by protrusion 247M of control member 245M (e.g., being substantially entirely block or partially blocked by any control member 245 that is tripped to the center position as a control member "245M"). At step 520, light beam 600 may be blocked by at least one control member 245 (e.g., denoted as control member "245M"). FIG. 10B illustrates at least one control member 245 (e.g., having protrusion 247M) that may be in a second position that blocks light beam 600. At step 520, notification assembly 310 activates by emitting an audio alarm, emitting a visual alarm (e.g., flashing lights), and/or transmitting a data notification to device 330 (e.g., a user device such as a smart device or other computing device). Personnel such as operating personnel, maintenance personnel, and/or other personnel that may hear or see activated notification assembly 310 or be notified via one or more devices 330 may approach and investigate system 100 (e.g., electrical control system 200) and/or notify operating or maintenance personnel to investigate the alarm.

Process 500 then proceeds from step 520 to step 525. At step 525, operating personnel may open access member 215 to visually inspect control members 245 (e.g., including control member 245M) of system 100 that has been tripped to emit an alarm as described above. Operating and/or maintenance personnel may note the particular control member 245 (e.g., control member "245M") that has been tripped and may determine respective component 260 associated with the tripped control member 245 (e.g., one or more control members 245M) for example by reading notations included on attachment assembly 225 or by any other notation system in use by operating and/or maintenance personnel. Operating and/or maintenance personnel may thereby quickly pinpoint one or more components 260 in a fault condition based on the operation of system 100. If desired during step 525, operating and/or maintenance personnel may disconnect connector 355 from connector 315 or make any other suitable adjustments to system 100 to de-activate (e.g., silence) notification assembly 310 while working to resolve the identified fault condition. Once operating and/or maintenance personnel have taken suitable corrective action regarding the fault condition associated with one or more tripped control members 245 (e.g., denoted by "245M") and one or more associated components 260, process 500 may proceed to step 510 (e.g., or proceed to step 530 to exit process 500).

After returning to step 510, operating and/or maintenance personnel may reset control members 245 (e.g., including one or more control members "245M") to an "on" or "off" position in which protrusion 247 (e.g., protrusion "247M") is disposed toward a side (e.g., not in a center) of control member 245. As described and illustrated above, control members 245 are denoted as "245M" when in the second position (e.g., center position). Notification system 200 may thereby be restored to the normal mode of operation in which one or more light beams 600 are not obstructed (e.g., as illustrated in FIGS. 7A, 9A, and 9B). Operating and/or maintenance personnel may close access member 215 and process 500 may proceed as described above for any desired time period or number of iterations between steps 510 and 525.

In at least some exemplary embodiments, personnel (e.g., operating and/or maintenance personnel) may retrofit an existing electrical control system 200 with notification system 300 or notification system 300A. Personnel may attach notification assembly 310 to existing access member 215 or provide a new cover member 210A and/or access member 215A having notification assembly 310 (e.g., including housing 217A). Personnel may provide power supply 305 in cavity 220 and attach connector 315 to attachment assembly 225 as illustrated in FIG. 3. Alternatively, personnel may provide power supply 305 as co-located with amplification and emission assembly 320 as illustrated in FIG. 6. With cover member 210 removed, personnel may dispose structural assembly 325 having amplification and emission assembly 320 in recess 240, and then re-attach cover member 210 as illustrated in FIG. 1 (e.g., or similarly provide the arrangement of system 100A as illustrated in FIG. 6).

In at least some exemplary embodiments, the exemplary disclosed method may include removably attaching a light beam emitter (e.g., emitter assembly 340) to an electrical control assembly (e.g., electrical control system 200) having at least one control member (e.g., control member 245) that is electrically connected to an electrical component (e.g., component 260); emitting a light beam (e.g., light beam 600) from the light beam emitter across the at least one control member; moving the at least one control member between a first position in which the light beam is unblocked by the at least one control member and a second position in which the light beam is blocked by the at least one control member; and connecting the light beam emitter to a notification device (e.g., notification assembly 310) via an electrical circuit. The exemplary disclosed method may also include preventing electrical current flow to the notification device when the at least one control member is in the first position; allowing electrical current flow to the notification device by switching the electrical circuit when the at least one control member moves from the first position to the second position; and moving the at least one control member from the first position to the second position when the at least one control member detects an electrical fault condition of the electrical component. The exemplary disclosed method may further include removably attaching the structural assembly at a recess of an attachment assembly that is disposed in a cavity of the electrical control assembly. Removably attaching the light beam emitter to the electrical control assembly may include attaching the light beam emitter to a structural assembly. The electrical control assembly may be a circuit breaker panel and the at least one control member may be a plurality of circuit breakers. The structural assembly may be removably attached to the recess of the attachment assembly by removing a cover member of the circuit breaker panel, disposing the structural assembly in the recess of the attachment assembly, and re-attaching the cover member of the circuit breaker panel. The light beam emitter may include an emitter member attached to a first end portion of the structural assembly and a receiver member attached to a second end portion of the structural assembly. The emitter member may be aligned to emit the light beam across the plurality of circuit breakers to the receiver member when the structural assembly is removably attached to the recess of the attachment assembly. Each of the plurality of circuit breakers may include a circuit breaker handle that blocks the light beam when each of the plurality of circuit breakers is in the second position. The electrical circuit may include a power supply and an optical fiber amplifier. The optical fiber amplifier may be powered by the power supply. The optical fiber amplifier may be connected to the light beam emitter via at least one fiber optic cable. The power supply may be disposed in a housing located in the cavity of the electrical control assembly. The optical fiber amplifier may be disposed in the recess of the attachment assembly. The power supply and the optical fiber amplifier may be disposed in the recess of the attachment assembly. The electrical control assembly may include an access door that accesses the cavity. The access door may include an aperture that is covered with a housing, the housing configured to receive a portion of the power supply when the access door is closed. The optical fiber amplifier may be electrically connected to the power supply via a connector attached to the attachment assembly. The notification device may be selected from the group of an alarm that emits noise and light, a transmitter, and combinations thereof.

In at least some exemplary embodiments, the exemplary disclosed apparatus may be for providing a notification for an electrical control assembly (e.g., electrical control system 200) having at least one control member (e.g., control member 245) that is electrically connected to an electrical component (e.g., component 260), the at least one control member supported by an attachment assembly, which is disposed in a cavity of the electrical control assembly and includes a recess, the at least one control member movable between a first position and a second position. The apparatus may include a structural assembly that is removably insertable in the recess of the attachment assembly; a through-beam emitter (e.g., emitter assembly 340) having an emitter member that is attached to a first end portion of the structural assembly and a receiver member that is attached to a second end portion of the structural assembly, the emitter member aligned to emit a light beam (e.g., light beam 600) along a straight line of sight to the receiver member; an optical fiber amplifier that is attached to the emitter member and the receiver member via fiber optic cables; and an electrical circuit including a power supply that powers the optical fiber amplifier and a notification device (e.g., notification assembly 310). The electrical circuit may block current flow to the notification device when the at least one control member is in the first position in which the at least one control member does not block the straight line of sight. The electrical circuit may allow current flow to the notification device when the at least one control member is in the second position in which the at least one control member blocks the straight line of sight. The structural assembly may include a first structural member at the first end portion having a first interior cavity. The structural assembly may include a second structural member at the second end portion having a second interior cavity. The emitter member may be disposed in the first interior cavity. The receiver member may be disposed in the second interior cavity. A first aperture may be disposed in a first wall member of the first structural member, the first aperture being an opening to the first interior cavity and aligned with the straight line of sight. A second aperture may be disposed in a second wall member of the second structural member, the second aperture being an opening to the second interior cavity and aligned with the straight line of sight. The emitter member may be configured to emit the light beam through the first aperture and the second aperture to the receiver member. The power supply may be a transformer that converts 120 VAC power to 24 VDC power. The fiber optic cables may have an optical fiber core diameter of 1.5 mm and a total cable diameter of 2.2 mm, the fiber optic cables including PMMA fiber material surrounded by polyethylene material. The emitter member and the receiver member may be nickel-plated brass members having an M4 head size and 0.7 mm thread pitch. The at least one control member may be a plurality of circuit breakers disposed along the straight line of sight. Each of the plurality of circuit breakers may include a circuit breaker handle. When each of the plurality of circuit breakers is in the first position, each circuit breaker handle may be positioned to a side of the circuit breaker and is not in the straight line of sight. When each of the plurality of circuit breakers is in the second position, each circuit breaker handle may be positioned at a mid-point position of the circuit breaker and blocks the straight line of sight.

In at least some exemplary embodiments, the exemplary disclosed method may include providing a structural assembly to which a light beam emitter (e.g., emitter assembly 340) may be attached; removably attaching the structural assembly at a recess of an attachment assembly that is disposed in a cavity of a circuit breaker panel, a plurality of circuit breakers (e.g., control member 245) supported by the attachment assembly and at least some of the plurality of circuit breakers electrically connected to at least one electrical component (e.g., component 260); and emitting a light beam (e.g., light beam 600) from the light beam emitter across the plurality of circuit breakers. The exemplary disclosed method may also include moving at least some of the plurality of circuit breakers between a first position in which the light beam is unblocked by a handle of the circuit breaker and a second position in which the light beam is blocked by a handle of the circuit breaker; connecting the light beam emitter to a notification device (e.g., notification assembly 310) via an electrical circuit; preventing electrical current flow to the notification device when all of the plurality of circuit breakers are in the first position; allowing electrical current flow to the notification device by switching the electrical circuit when at least one of the plurality of circuit breakers moves from the first position to the second position; and moving at least some of the plurality of circuit breakers from the first position to the second position when the circuit breaker detects an electrical fault condition of the electrically-connected at least one electrical component. Removably attaching the structural assembly to the recess of the attachment assembly may include removing a cover member of the circuit breaker panel, disposing the structural assembly in the recess of the attachment assembly, and re-attaching the cover member of the circuit breaker panel. The exemplary disclosed method may further include resetting the plurality of circuit breakers from the second position to the first position after the notification device is activated by the current flow to emit an alarm. The light beam may pass between the handles of the plurality of circuit breakers when all of the plurality of circuit breakers are in the first position and electrical current flow to the notification device is prevented. The circuit breaker panel may be a three-phase 30-circuit panel or a three-phase 42-circuit panel.

In at least some exemplary embodiments, the exemplary disclosed apparatus, system, and method may provide an immediate indication of the location of an electrical control assembly such as a circuit breaker panel having a circuit breaker that has been tripped. The exemplary disclosed apparatus, system, and method may pinpoint the location of a tripped circuit breaker so that operating personnel can be made immediately aware of a circuit breaker that has been tripped and its location in a facility, including personnel who are unfamiliar with a given electrical layout. The exemplary disclosed apparatus, system, and method may thereby alert operating personnel immediately when electrically-powered equipment has lost power. The exemplary disclosed apparatus, system, and method may allow existing electrical control assemblies to be quickly and efficiently retrofitted for relatively little cost. For example, the exemplary disclosed apparatus, system, and method may be easily retrofitted onto any suitable existing circuit breaker panel by any manufacturer at relatively little cost.

It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not obscure the embodiments.

It will be apparent to those skilled in the art that various modifications and variations can be made to the exemplary disclosed apparatus, system, and method. Other embodiments will be apparent to those skilled in the art from consideration of the specification and practice of the exemplary disclosed apparatus, system, and method. It is intended that the specification and examples be considered as exemplary, with a true scope being indicated by the following claims.

What is claimed is:

1. An apparatus for an electrical control assembly having at least one control member that is electrically connected to an electrical component, the at least one control member supported by an attachment assembly, which is disposed in a cavity of the electrical control assembly and includes a recess, the at least one control member movable between a first position and a second position, the apparatus comprising:
   a structural assembly that is removably insertable in the recess of the attachment assembly;
   a through-beam emitter having an emitter member that is attached to a first end portion of the structural assembly and a receiver member that is attached to a second end portion of the structural assembly, the emitter member aligned to emit a light beam along a straight line of sight to the receiver member; and
   an electrical circuit;
   wherein the electrical circuit blocks current flow when the at least one control member is in the first position in which the at least one control member does not block the straight line of sight; and
   wherein the electrical circuit allows current flow when the at least one control member is in the second position in which the at least one control member blocks the straight line of sight.

2. The apparatus of claim 1, wherein the structural assembly includes a structural member at the first end portion having an interior cavity.

3. The apparatus of claim 2, wherein the emitter member is disposed in the interior cavity.

4. The apparatus of claim 3, wherein an aperture is disposed in a wall member of the structural member, the aperture being an opening to the interior cavity and aligned with the straight line of sight.

5. The apparatus of claim 1, wherein the structural assembly includes a structural member at the second end portion having an interior cavity.

6. The apparatus of claim 5, wherein the receiver member is disposed in the interior cavity.

7. The apparatus of claim 6, wherein an aperture is disposed in a wall member of the structural member, the aperture being an opening to the interior cavity and aligned with the straight line of sight.

8. An apparatus for providing a notification for an electrical control assembly having at least one control member that is electrically connected to an electrical component, the at least one control member supported by an attachment assembly, which is disposed in a cavity of the electrical control assembly and includes a recess, the at least one control member movable between a first position and a second position, the apparatus comprising:
- a structural assembly that is removably insertable in the recess of the attachment assembly;
- a through-beam emitter having an emitter member that is attached to a first end portion of the structural assembly and a receiver member that is attached to a second end portion of the structural assembly, the emitter member aligned to emit a light beam along a straight line of sight to the receiver member; and
- an electrical circuit including a notification device;
- wherein the electrical circuit blocks current flow to the notification device when the at least one control member is in the first position in which the at least one control member does not block the straight line of sight; and
- wherein the electrical circuit allows current flow to the notification device when the at least one control member is in the second position in which the at least one control member blocks the straight line of sight.

9. The apparatus of claim 8, further comprising an amplifier that is electrically connected to the emitter member and the receiver member.

10. The apparatus of claim 9, wherein the electrical circuit includes a power supply that powers the notification device and the amplifier.

11. The apparatus of claim 8, wherein the electrical circuit includes a power supply that powers the notification device.

12. The apparatus of claim 8, wherein the structural assembly includes a structural member at the first end portion having an interior cavity, the emitter member being disposed in the interior cavity.

13. The apparatus of claim 12, wherein an aperture is disposed in a wall member of the structural member, the aperture being an opening to the interior cavity and aligned with the straight line of sight.

14. The apparatus of claim 8, wherein the structural assembly includes a structural member at the second end portion having an interior cavity, the receiver member being disposed in the interior cavity.

15. The apparatus of claim 14, wherein an aperture is disposed in a wall member of the structural member, the aperture being an opening to the interior cavity and aligned with the straight line of sight.

16. A method, comprising:
- providing a structural assembly to which a light beam emitter is attached;
- removably attaching the structural assembly at a recess of an attachment assembly that is disposed in a cavity of an electrical control assembly, at least one control member supported by the attachment assembly and electrically connected to at least one electrical component;
- emitting a light beam from the light beam emitter across the at least one control member;
- moving the at least one control member between a first position in which the light beam is unblocked by the at least one control member and a second position in which the light beam is blocked by the at least one control member;
- connecting the light beam emitter to a notification device via an electrical circuit;
- preventing electrical current flow to the notification device when the at least one control member is in the first position; and
- allowing electrical current flow to the notification device by switching the electrical circuit when the at least one control member moves from the first position to the second position.

17. The method of claim 16, further comprising moving the at least one control member from the first position to the second position when the at least one control member detects an electrical fault condition of the electrically-connected at least one electrical component.

18. The method of claim 17, further comprising resetting the at least one control member from the second position to the first position after the notification device is activated by the current flow to emit an alarm.

19. The method of claim 16, wherein removably attaching the structural assembly to the recess of the attachment assembly includes removing a cover member of the electrical control assembly, and disposing the structural assembly in the recess of the attachment assembly.

20. The method of claim 19, wherein removably attaching the structural assembly to the recess of the attachment assembly further includes re-attaching the cover member of the electrical control assembly.

* * * * *